(12) United States Patent
Kojima et al.

(10) Patent No.: US 8,729,564 B2
(45) Date of Patent: *May 20, 2014

(54) SEMICONDUCTOR LIGHT EMITTING DEVICE AND METHOD FOR MANUFACTURING SAME

(71) Applicant: Kabushiki Kaisha Toshiba, Tokyo (JP)

(72) Inventors: Akihiro Kojima, Kanagawa-ken (JP); Yoshiaki Sugizaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/865,546

(22) Filed: Apr. 18, 2013

(65) Prior Publication Data

US 2013/0234154 A1 Sep. 12, 2013

Related U.S. Application Data

(63) Continuation of application No. 12/793,943, filed on Jun. 4, 2010, now Pat. No. 8,445,916.

(30) Foreign Application Priority Data

Mar. 9, 2010 (JP) .................. 2010-051413

(51) Int. Cl.
*H01L 33/40* (2010.01)
*H01L 33/48* (2010.01)

(52) U.S. Cl.
USPC .......... 257/76; 257/98; 257/99; 257/E33.025; 257/E33.061; 257/E33.062

(58) Field of Classification Search
USPC ............... 257/E21.599, E33.025, E33.061, 257/E33.062, E33.056, 76–103; 438/27, 33
See application file for complete search history.

(56) References Cited

U.S. PATENT DOCUMENTS

| 6,331,450 B1 | 12/2001 | Uemura |
| 2004/0245530 A1 | 12/2004 | Kameyama et al. |

(Continued)

FOREIGN PATENT DOCUMENTS

| JP | 2002-118293 | 4/2002 |
| JP | 2005-191521 | 7/2005 |

(Continued)

OTHER PUBLICATIONS

Taiwanese Office Action for Taiwanese Patent Application No. 099129341 mailed on Apr. 15, 2013.

(Continued)

*Primary Examiner* — Whitney T Moore
(74) *Attorney, Agent, or Firm* — White & Case LLP

(57) ABSTRACT

According to one embodiment, a semiconductor light emitting device includes a semiconductor layer, a first electrode, a second electrode, an insulating film, a first interconnection, a second interconnection, a barrier metal layer, a first metal pillar, a second metal pillar, and a resin. The semiconductor layer has a first major surface, a second major surface formed on an opposite side to the first major surface, and a light emitting layer. The first electrode is provided on the second major surface of the semiconductor layer. The second electrode is provided on the second major surface of the semiconductor layer and includes a silver layer. The insulating film is provided on the second major surface side of the semiconductor layer. The barrier metal layer is provided between the second electrode and the insulating film and between the second electrode and the second interconnection to cover the second electrode.

21 Claims, 12 Drawing Sheets

(56) References Cited

U.S. PATENT DOCUMENTS

| | | |
|---|---|---|
| 2005/0145875 A1 | 7/2005 | Kim |
| 2005/0156185 A1 | 7/2005 | Kim et al. |
| 2010/0051978 A1 | 3/2010 | Katsuno et al. |
| 2010/0148198 A1 | 6/2010 | Sugizaki et al. |
| 2011/0114978 A1 | 5/2011 | Kojima et al. |
| 2011/0114986 A1 | 5/2011 | Kojima et al. |
| 2011/0204396 A1 | 8/2011 | Akimoto et al. |
| 2011/0220931 A1 | 9/2011 | Kojima |

FOREIGN PATENT DOCUMENTS

| | | |
|---|---|---|
| JP | 2008-191528 | 8/2008 |
| JP | 2009-049266 | 3/2009 |
| JP | 2009-099675 | 5/2009 |
| TW | 2007-39958 | 10/2007 |
| WO | 2006/043796 | 4/2006 |
| WO | 2008/069429 | 6/2008 |
| WO | 2008091319 | 7/2008 |
| WO | 2009/064330 | 5/2009 |

OTHER PUBLICATIONS

Extended European Search Report for European Patent Application Serial No. 10165209.7 mailed on Jul. 13, 2011.

Japanese Office Action for Japanese Application No. 2010-051413 mailed on Sep. 12, 2012.

European Examination Report for European Application No. 10165209.7 mailed Sep. 5, 2012.

U.S. Office Action mailed on May 15, 2012 corresponding to U.S. Appl. No. 12/793,943, filed Jun. 4, 2010.

Japanese Office Action for Japanese Application No. 2010-051413 mailed on May 17, 2012.

U.S. Office Action mailed on Oct. 3, 2012 corresponding to U.S. Appl. No. 12/793,943, filed Jun. 4, 2010.

Japanese Office Action issued in corresponding JP Application No. 2013-019803 on Sep. 5, 2013, along with English translation thereof.

SEMICONDUCTOR LIGHT EMITTING DEVICE AND METHOD FOR MANUFACTURING SAME

CROSS-REFERENCE TO RELATED APPLICATIONS

This application is a Continuation of application Ser. No. 12/793,943 filed Jun. 4, 2010; the entire contents of which are incorporated herein by reference.

This application is based upon and claims the benefit of priority from Japanese Patent Application No. 2010-051413, filed on Mar. 9, 2010; the entire contents of which are incorporated herein by reference.

BACKGROUND

There is known a nitride semiconductor light emitting element for flip chip package having a structure in which the p-side electrode includes a reflective electrode layer made of silver (Ag), for instance. In such a structure, degradation of the reflective electrode layer may affect the product lifetime.

DETAILED DESCRIPTION

According to one embodiment, a semiconductor light emitting device includes a semiconductor layer, a first electrode, a second electrode, an insulating film, a first interconnection, a second interconnection, a barrier metal layer, a first metal pillar, a second metal pillar, and a resin. The semiconductor layer has a first major surface, a second major surface formed on an opposite side to the first major surface, and a light emitting layer. The first electrode is provided on the second major surface of the semiconductor layer. The second electrode is provided on the second major surface of the semiconductor layer and includes a silver layer. The insulating film is provided on the second major surface side of the semiconductor layer and includes a first opening and a second opening. The first interconnection is provided on a part of a surface of the insulating film on an opposite side to the semiconductor layer and in the first opening and is connected to the first electrode. The second interconnection is provided on another part of the surface of the insulating film on the opposite side to the semiconductor layer and in the second opening and is connected to the second electrode. The barrier metal layer is provided between the second electrode and the insulating film and between the second electrode and the second interconnection to cover the second electrode. The barrier metal layer is made of a metal material. The second electrode, the first interconnection, and the second interconnection is made of another metal material. The first metal pillar is provided on a surface of the first interconnection on an opposite side to the first electrode. The second metal pillar is provided on a surface of the second interconnection on an opposite side to the second electrode. The resin covers a periphery of the first metal pillar and a periphery of the second metal pillar.

Embodiments will now be described with reference to the drawings.

Figure 1:
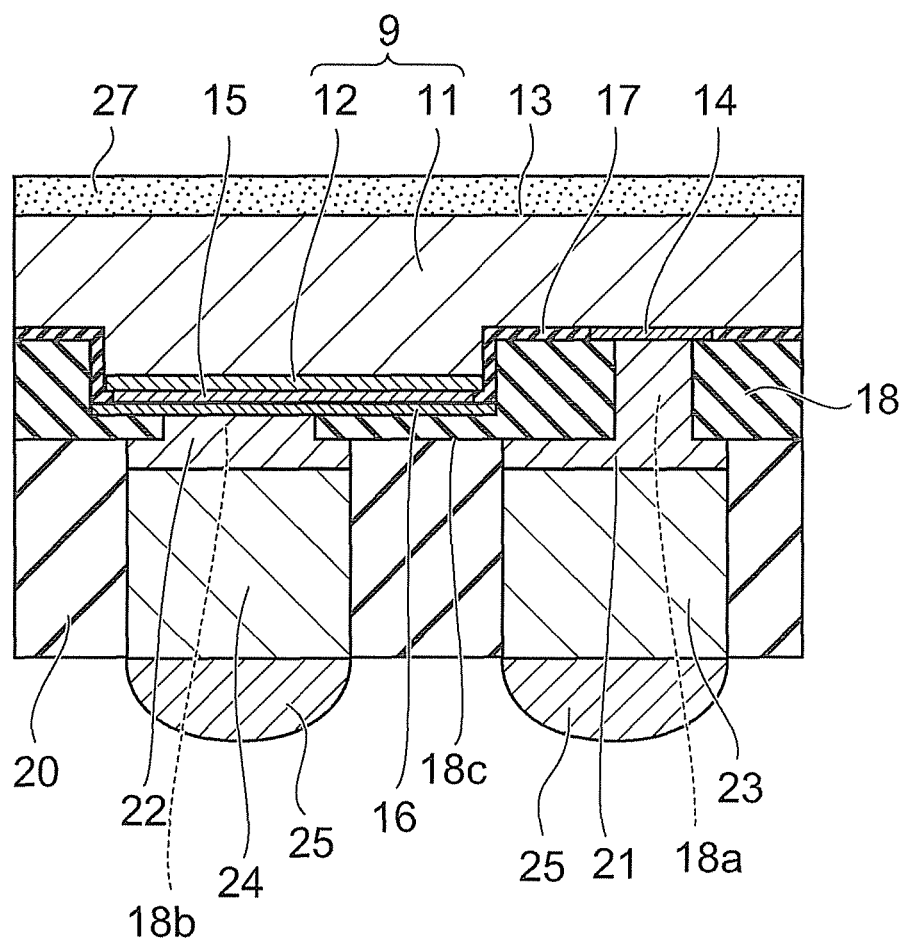
FIG. 1 is a schematic cross-sectional view of a semiconductor light emitting device of this embodiment.

FIG. 1 is a schematic cross-sectional view of a semiconductor light emitting device of this embodiment.

The semiconductor light emitting device of this embodiment includes a semiconductor layer 9 including a light emitting layer, a package structure section including an interconnect layer, and a phosphor layer 27, which are formed collectively in a wafer state. The semiconductor layer 9 includes a first semiconductor layer 11 and a second semiconductor layer 12. The first semiconductor layer 11 is illustratively an n-type GaN layer and functions as a lateral current path. However, the conductivity type of the first semiconductor layer 11 is not limited to n-type, but may be p-type.

The first major surface (upper surface) 13 of the first semiconductor layer 11 functions as a light extraction surface, and light is extracted to the outside mainly from the first major surface 13. The second semiconductor layer 12 is provided on the second major surface (lower surface) of the first semiconductor layer 11 on the opposite side to the first major surface 13.

Figure 2:
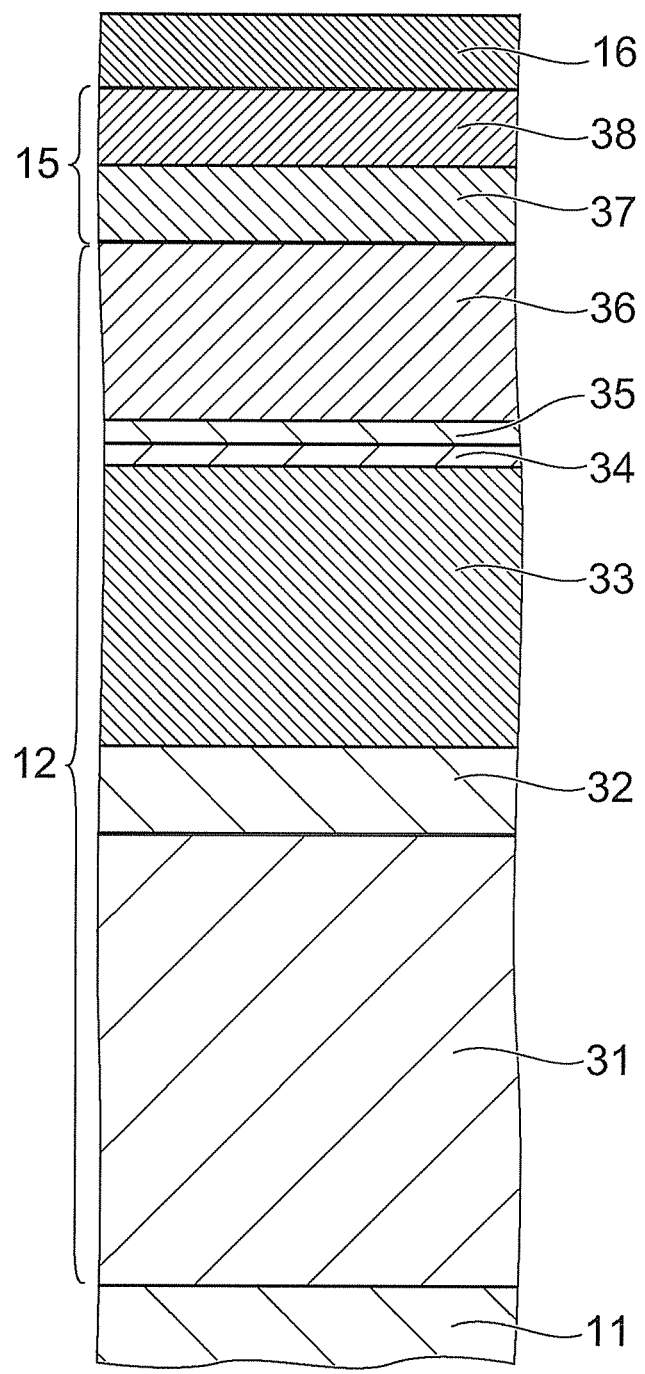
FIG. 2 is an enlarged schematic cross-sectional view near the light emitting layer in FIG. 1.

The second semiconductor layer 12 has a stacked structure of a plurality of semiconductor layers including a light emitting layer (active layer). FIG. 2 shows an example of this structure.

An n-type GaN layer 31 is provided on the second major surface of the first semiconductor layer 11. An n-type InGaN layer 32 is provided on the GaN layer 31. A light emitting layer 33 is provided on the InGaN layer 32. The light emitting layer 33 illustratively has a multiple quantum well structure including InGaN. A p-type GaN layer 34 is provided on the light emitting layer 33. A p-type AlGaN layer 35 is provided on the GaN layer 34. A p-type GaN layer 36 is provided on the AlGaN layer 35.

Part of the second major surface side of the first semiconductor layer 11 includes a protrusion, and the second semiconductor layer 12 is provided on the surface of the protrusion. The second semiconductor layer 12 is smaller in planar size than the first semiconductor layer 11. An n-side electrode 14 is provided as a first electrode on a portion of the second major surface of the first semiconductor layer 11 where the second semiconductor layer 12 is not provided.

A p-side electrode 15 is provided as a second electrode on the opposite surface of the second semiconductor layer 12 from the surface in contact with the first semiconductor layer 11. As shown in FIG. 2, the p-side electrode 15 includes a contact layer 37 provided on the GaN layer 36, and a silver (Ag) layer 38 provided on the contact layer 37. The contact layer 37 is illustratively a nickel (Ni) layer, which can form a good ohmic contact with the GaN layer 36.

The second major surface of the first semiconductor layer 11 is covered with an insulating film 17 such as silicon oxide film. The n-side electrode 14 and the p-side electrode 15 are exposed from the insulating film 17. The n-side electrode 14 and the p-side electrode 15 are insulated by the insulating film 17 and serve as electrodes electrically independent of each other. Furthermore, the insulating film 17 also covers the side surface of the protrusion of the first semiconductor layer 11 and the side surface (or end portion) of the second semiconductor layer 12 formed on the protrusion.

A barrier metal layer 16 made of a metal material different from that of the p-side electrode 15 is provided on the surface of the p-side electrode 15 on the opposite side to the second semiconductor layer 12. An insulating film 18 covers the insulating film 17 and the barrier metal layer 16. The barrier metal layer 16 is provided between the p-side electrode 15 and the insulating film 18, and between the p-side electrode 15 and a p-side interconnection 22 described later.

Figure 3A:
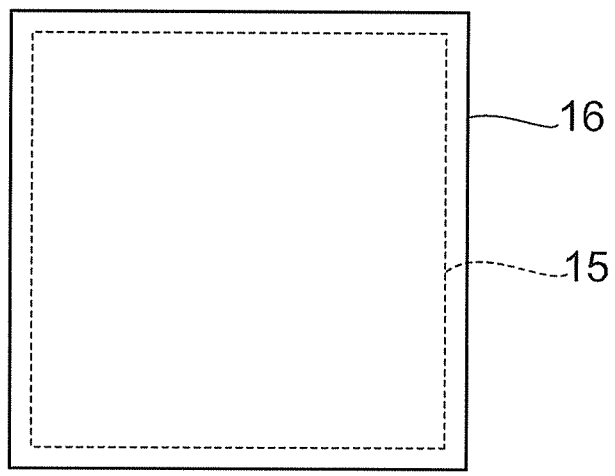
FIG. 3A shows an example planar layout of the p-side electrode and the barrier metal layer.

FIG. 3A shows an example planar layout of the p-side electrode 15 and the barrier metal layer 16. The planar size of the barrier metal layer 16 is larger than the planar size of the p-side electrode 15, and the barrier metal layer 16 covers the entire surface of the p-side electrode 15 on the opposite side to the second semiconductor layer 12.

Returning to FIG. 1, the insulating film 18 is provided on the second major surface side of the first semiconductor layer 11 so as to cover the insulating film 17, the n-side electrode 14, the p-side electrode 15, and the barrier metal layer 16. The insulating film 18 is illustratively made of silicon oxide film or resin.

The surface 18c of the insulating film 18 on the opposite side to the first semiconductor layer 11 and the second semiconductor layer 12 is planarized, and an n-side interconnection 21 as a first interconnection and a p-side interconnection 22 as a second interconnection are provided on the surface 18c.

The n-side interconnection 21 is provided also in the opening 18a formed in the insulating film 18 and reaching the n-side electrode 14, and is electrically connected to the n-side electrode 14. The p-side interconnection 22 is provided also in the opening 18b formed in the insulating film 18 and reaching the barrier metal layer 16, and is electrically connected to the barrier metal layer 16. The p-side interconnection 22 is electrically connected to the p-side electrode 15 through the barrier metal layer 16.

For instance, the n-side interconnection 21 and the p-side interconnection 22 are simultaneously formed by a plating process in which a seed metal formed on the surface of the insulating film 18, including the inner wall surface of the openings 18a, 18b, is used as a current path.

The n-side electrode 14, the p-side electrode 15, the n-side interconnection 21, and the p-side interconnection 22 are all provided on the opposite side (second major surface side) of the first semiconductor layer 11 from the first major surface 13, and constitute an interconnect layer for supplying a current to the light emitting layer.

An n-side metal pillar 23 is provided as a first metal pillar on the surface of the n-side interconnection 21 on the opposite side to the n-side electrode 14. A p-side metal pillar 24 is provided as a second metal pillar on the surface of the p-side interconnection 22 on the opposite side to the p-side electrode 15 and the barrier metal layer 16. The periphery of the n-side metal pillar 23, the periphery of the p-side metal pillar 24, the n-side interconnection 21, and the p-side interconnection 22 are covered with a resin 20.

The first semiconductor layer 11 is electrically connected to the n-side metal pillar 23 through the n-side electrode 14 and the n-side interconnection 21. The second semiconductor layer 12 is electrically connected to the p-side metal pillar 24 through the p-side electrode 15, the barrier metal layer 16, and the p-side interconnection 22. External terminals 25 such as solder balls and metal bumps are provided on the lower end surface of the n-side metal pillar 23 and the p-side metal pillar 24 exposed from the resin 20. The semiconductor light emitting device can be electrically connected to external circuits through the external terminals 25.

The thickness of the n-side metal pillar 23 (vertical thickness in FIG. 1) is thicker than the thickness of the stacked body including the semiconductor layer 9, the n-side electrode 14, the p-side electrode 15, the barrier metal layer 16, the insulating films 17, 18, the n-side interconnection 21, and the p-side interconnection 22. Likewise, the thickness of the p-side metal pillar 24 is also thicker than the thickness of the aforementioned stacked body. If this condition is satisfied, the ratio of thickness to planar size of each metal pillar 23, 24 is not limited to one or more, but the ratio may be less than one. That is, the thickness of the n-side metal pillar 23 may be smaller than its planar size.

In the structure of this embodiment, even if the stacked body of the first semiconductor layer 11 and the second semiconductor layer 12 is thin, its mechanical strength can be maintained by thickening the n-side metal pillar 23, the p-side metal pillar 24, and the resin 20 covering the periphery thereof as described above. Furthermore, the n-side metal pillar 23 and the p-side metal pillar 24 can absorb and relax the stress applied to the semiconductor layer through the external terminals 25 when the device is mounted on a circuit board or the like. Preferably, the resin 20 serving to reinforce the n-side metal pillar 23 and the p-side metal pillar 24 has a thermal expansion coefficient which is equal or close to that of the circuit board and the like. Examples of such a resin 20 include epoxy resin, silicone resin, and fluororesin.

The n-side interconnection 21, the p-side interconnection 22, the n-side metal pillar 23, and the p-side metal pillar 24 can be made of such a material as copper, gold, nickel, and silver. Among them, it is more preferable to use copper, which has good thermal conductivity, high migration resistance, and superior contact with insulating films.

The phosphor layer 27 is provided on the first major surface 13 of the first semiconductor layer 11. The phosphor layer 27 is provided with a generally uniform thickness in the plane direction of the first major surface 13. The phosphor layer 27 can absorb the light from the light emitting layer and emit wavelength-converted light. Thus, it is possible to emit mixed light of the light from the light emitting layer and the wavelength-converted light of the phosphor layer 27. For instance, for a nitride-based light emitting layer, a white light, lamp light and the like can be obtained as a mixed light of blue light from the light emitting layer and yellow light, for instance, which is the wavelength-converted light of a yellow phosphor layer 27.

Light emitted from the light emitting layer passes mainly the first semiconductor layer 11, the first major surface 13, the phosphor layer 27, and is emitted to the outside. The light emitted from the light emitting layer is directed also to the side opposite to the first major surface 13.

Here, in this embodiment, as described above with reference to FIG. 2, the p-side electrode 15 includes a silver (Ag) layer 38. This silver (Ag) layer 38 functions as a reflective layer for reflecting the light directed to the side opposite to the first major surface 13 and directing it to the first major surface 13 side.

Silver (Ag) has high reflectance for wavelengths in the visible region, with the reflectance being 98% for light of 600 nm or more, 98% for light around 500-600 nm, and 97% for light around 450-500 nm.

Although scarcely oxidized in air, silver (Ag) reacts with hydrogen sulfide to form a sulfide film on the surface and tends to be sulfurized to brown and black. Sulfur (S) scarcely diffuses into the GaN layer, and hence penetration of sulfur (S) from the side of the first semiconductor layer 11 and the second semiconductor layer 12 is almost negligible. However, resin cannot block the penetration of sulfur (S). Sulfur (S) penetrated from air into the resin 20 may reach and sulfurize the silver (Ag) layer 38. Sulfidation of the silver (Ag) layer 38 decreases the reflectance and results in decreasing the product lifetime.

In this embodiment, to prevent the sulfidation reaction of the silver (Ag) layer 38 by sulfur (S), the surface of the p-side electrode 15 on the resin 20 side (the surface on the opposite side to the second semiconductor layer 12) is covered with the barrier metal layer 16. The barrier metal layer 16 blocks sulfur (S) penetrated from the resin 20 side from reaching the silver (Ag) layer 38. To achieve this, the barrier metal layer 16 is illustratively made of titanium (Ti), tantalum (Ta), ruthenium (Ru), aluminum (Al), or an alloy containing at least one of them.

This barrier metal layer 16 can prevent sulfidation of the silver (Ag) layer 38. Consequently, the decrease of reflectance of the silver (Ag) layer 38 can be suppressed, and highly efficient light emission characteristics can be achieved. Furthermore, degradation suppression of the silver (Ag) layer 38 leads to longer product lifetime.

The n-side interconnection 21 and the p-side interconnection 22 are illustratively copper (Cu) interconnections formed by plating. Here, the plating liquid contains sulfur (S). Sulfidation of the silver (Ag) layer 38 by this sulfur (S) can also be prevented by the barrier metal layer 16.

Furthermore, the barrier metal layer 16 is made of a metal material different from that of the n-side interconnection 21 and the p-side interconnection 22. The barrier metal layer 16 blocks copper (Cu) constituting the n-side interconnection 21 and the p-side interconnection 22 from diffusing into the p-side electrode 15. This can protect the p-side electrode 15 from contamination by copper (Cu).

Furthermore, if the barrier metal layer 16 is made of at least one metal selected from titanium (Ti), tantalum (Ta), and ruthenium (Ru), contact with the p-side interconnection 22 made of copper (Cu) can be enhanced, and the product reliability can be improved.

It is difficult for silver (Ag) to form ohmic contact with GaN. Thus, in this embodiment, as shown in FIG. 2, for instance, a nickel (Ni) layer forming an alloy with gallium (Ga) contained in the GaN layer 36 of the second semiconductor layer 12 is provided as a contact layer 37 between the GaN layer 36 and the silver (Ag) layer 38. This can reduce contact resistance between the p-side electrode 15 and the second semiconductor layer 12.

Next, a method for manufacturing a semiconductor light emitting device of this embodiment is described with reference to FIGS. 4A to 11B.

Figure 4A:
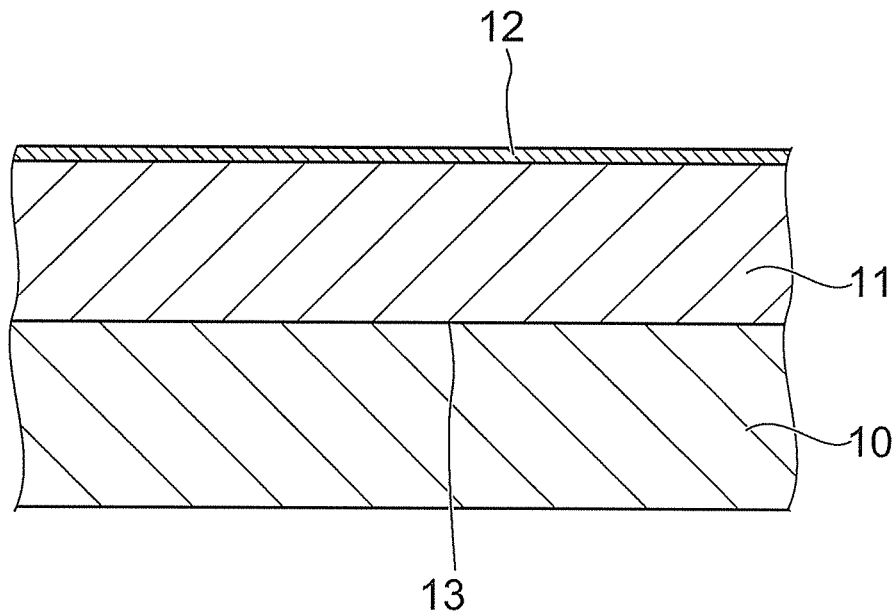
FIG. 4A to FIG. 11B are schematic cross-sectional views showing a method for manufacturing a semiconductor light emitting device of this embodiment.

First, as shown in FIG. 4A, a first semiconductor layer 11 is formed on the major surface of a substrate 10. The surface of the first semiconductor layer 11 on the substrate 10 side corresponds to the first major surface 13. A second semiconductor layer 12 is formed on the second major surface of the first semiconductor layer 11 on the opposite side to the first major surface 13. For instance, in the case where the light emitting layer is made of a nitride semiconductor, the stacked body of the first semiconductor layer 11 and the second semiconductor layer 12 can be crystal grown on a sapphire substrate.

Figure 4B:
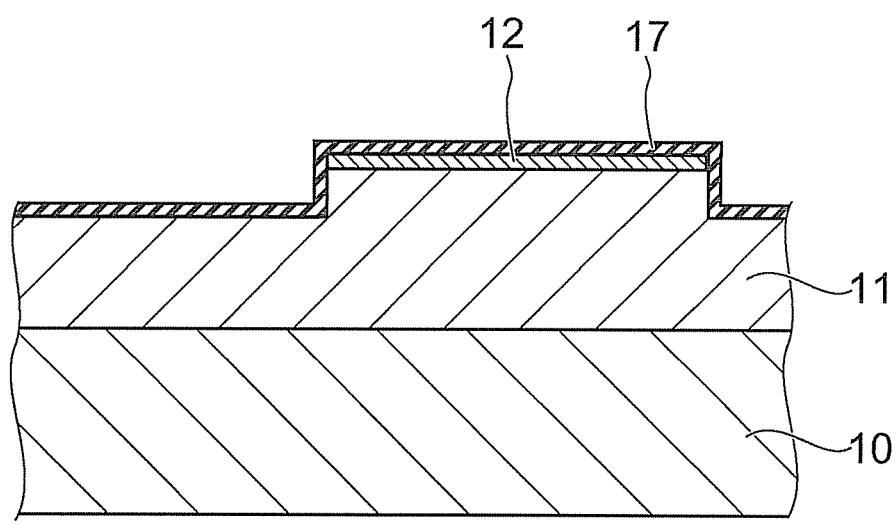

Next, for instance, an RIE (reactive ion etching) process using a mask, not shown, is used to selectively remove the first semiconductor layer 11 and the second semiconductor layer 12. As shown in FIG. 4B, part of the first semiconductor layer 11 on the second major surface side is processed into a protruding shape, and the second semiconductor layer 12 is selectively left on the surface of the protrusion.

Figure 3B:
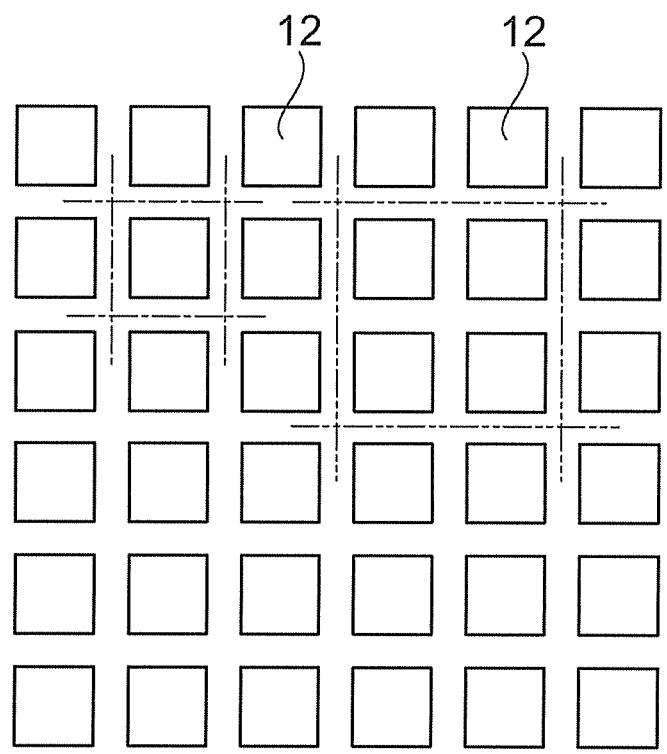
FIG. 3B shows an example planar layout of the second semiconductor layer in a wafer state.

The substrate 10 and the first semiconductor layer 11 are in a wafer state, and a plurality of second semiconductor layers 12 spaced from each other are selectively formed like islands on the first semiconductor layer 11 as shown in FIG. 3B.

Next, as shown in FIG. 4B, the second major surface of the first semiconductor layer 11 and the entire surface of the second semiconductor layer 12 are covered with an insulating film 17.

Figure 5A:
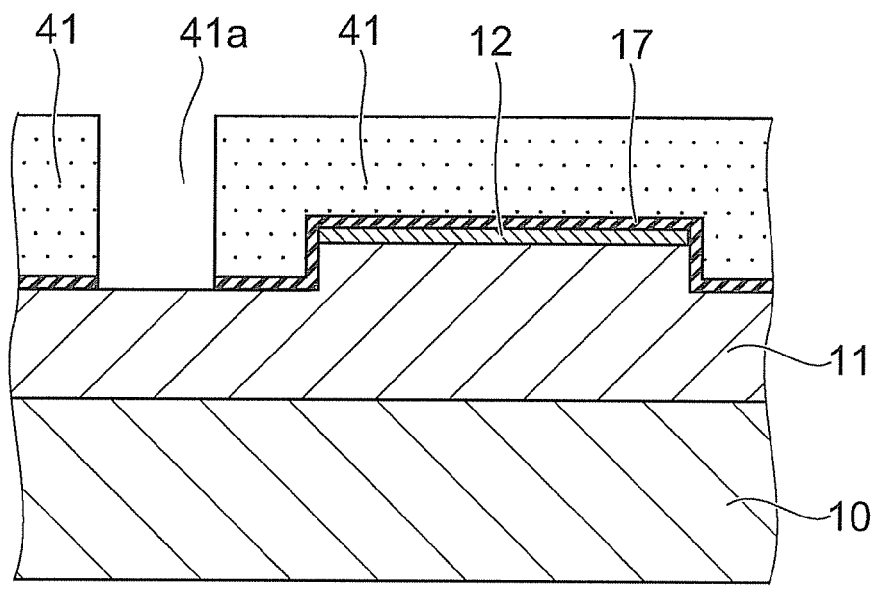

Next, as shown in FIG. 5A, a resist film 41 is formed on the insulating film 17, and an opening 41a is selectively formed in the resist film 41. Then, the insulating film 17 exposed to the bottom of the opening 41a is removed illustratively by wet etching. Thus, the first semiconductor layer 11 is exposed to the bottom of the opening 41a.

Figure 5B:
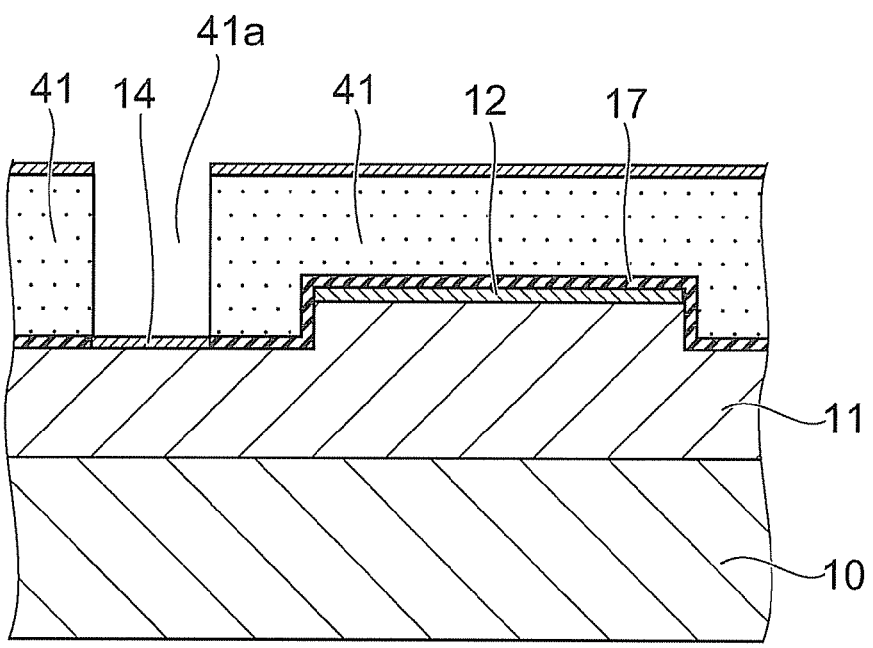

Next, as shown in FIG. 5B, an n-side electrode 14 is formed on the second major surface of the first semiconductor layer 11 exposed to the bottom of the opening 41a. The n-side electrode 14 has a structure in which, for instance, a titanium (Ti) film, an aluminum (Al) film, a nickel (Ni) film, and a gold (Au) film are formed sequentially from the first semiconductor layer 11 side by an evaporation process.

Next, the resist film 41 and the same metal film as the n-side electrode 14 formed on the upper surface of the resist film 41 are removed by a lift-off process (FIG. 6A), and then an annealing process is performed. By this annealing process, the film (e.g., titanium film) of the n-side electrode 14 in contact with the first semiconductor layer 11 is alloyed with gallium contained in the first semiconductor layer 11, and the n-side electrode 14 forms ohmic contact with the first semiconductor layer 11.

Figure 6A:
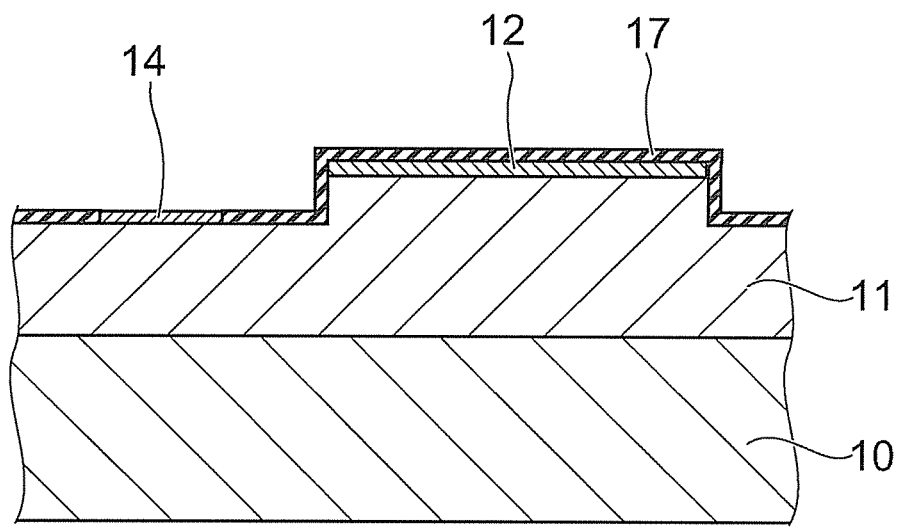
Figure 6B:
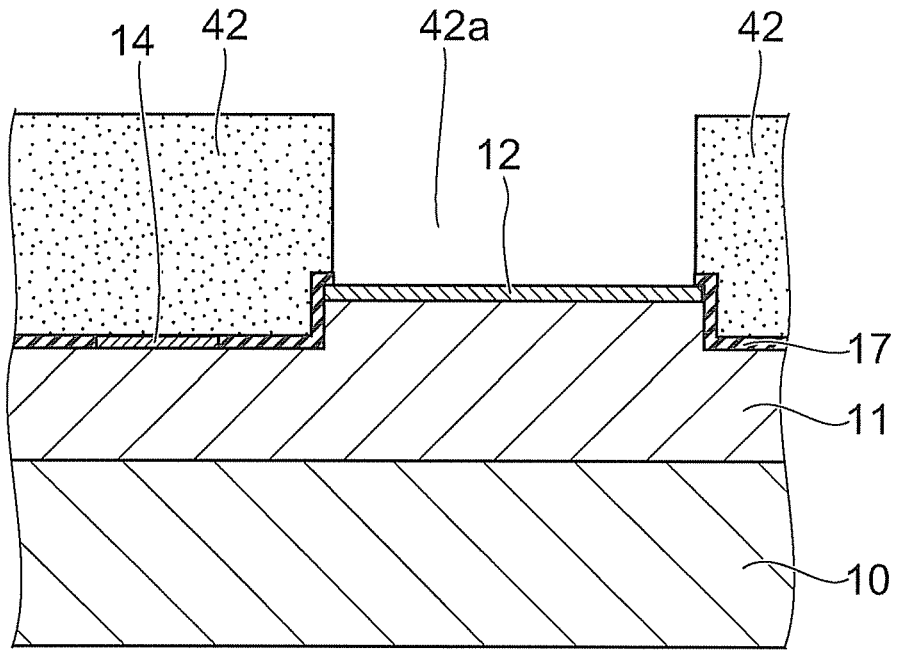

Next, as shown in FIG. 6B, a resist film 42 is formed on the insulating film 17 and the n-side electrode 14, and an opening 42a is selectively formed in the resist film 42. Then, the insulating film 17 exposed to the bottom of the opening 42a is removed illustratively by a wet etching. Thus, the second semiconductor layer 12 is exposed to the bottom of the opening 42a.

Figure 7A:
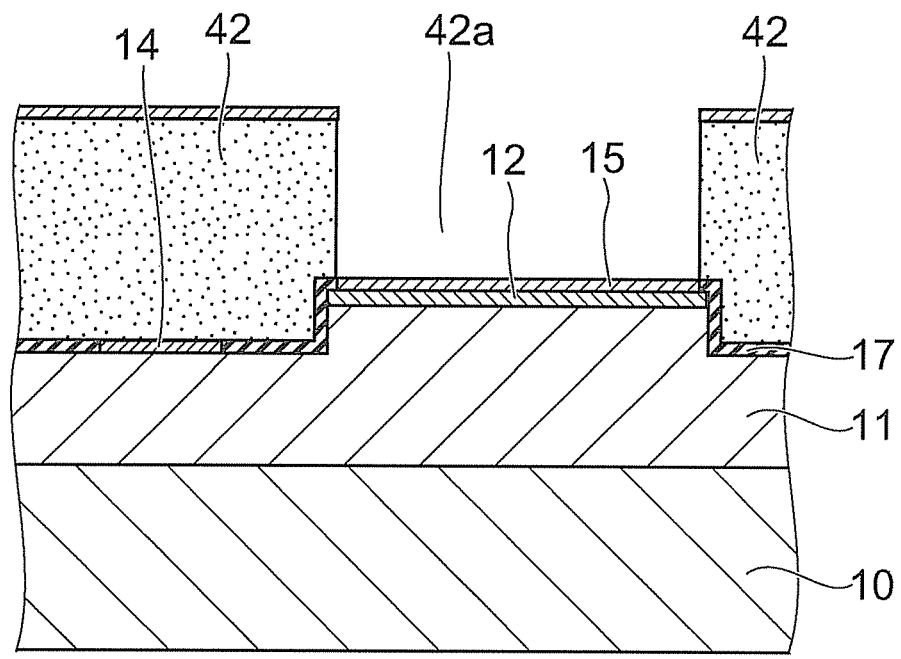
Figure 7B:
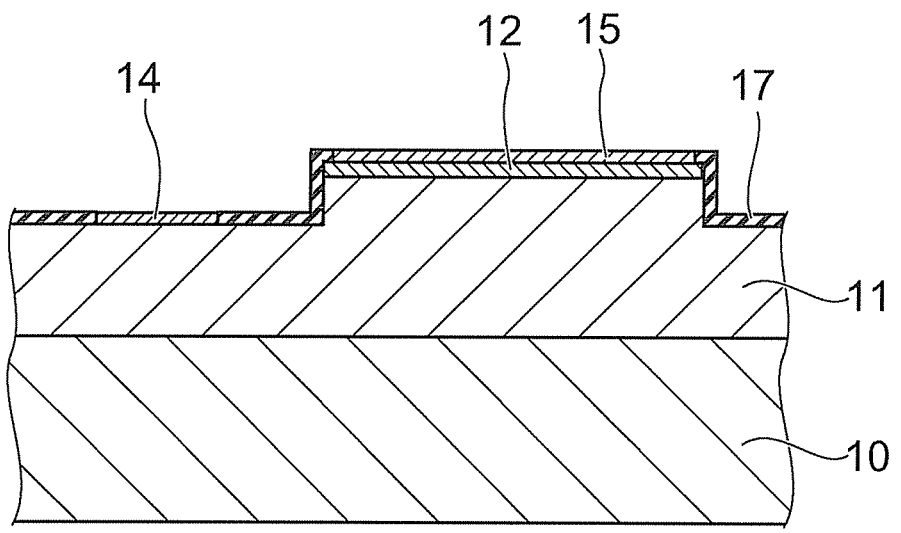

Next, as shown in FIG. 7A, a p-side electrode 15 is formed on the surface of the second semiconductor layer 12 exposed to the bottom of the opening 42a. The p-side electrode 15 has a structure in which, for instance, as shown in FIG. 2, a contact layer 37 and a silver (Ag) layer 38 are formed sequentially from the second semiconductor layer 12 side by an evaporation process.

Next, the resist film 42 and the same metal film as the p-side electrode 15 formed on the upper surface of the resist film 42 are removed by a lift-off process (FIG. 7B), and then an annealing process is performed. By this annealing process, the contact layer 37 such as a nickel (Ni) layer is alloyed with gallium (Ga) contained in the p-type GaN layer 36 of the second semiconductor layer 12, and the p-side electrode 15 forms ohmic contact with the second semiconductor layer 12.

Figure 8A:
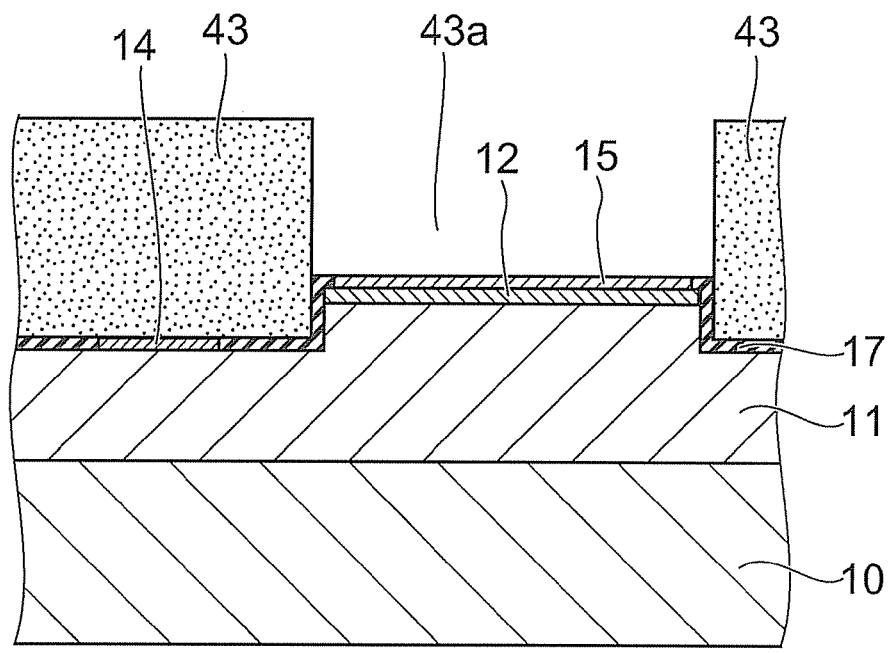

Next, as shown in FIG. 8A, a resist film 43 is formed on the insulating film 17, the n-side electrode 14, and the p-side electrode 15, and an opening 43a is selectively formed in the resist film 43 on the p-side electrode 15. The planar size of the opening 43a is larger than the planar size of the opening 42a for forming the p-side electrode 15, and the entire surface of the p-side electrode 15 is exposed to the bottom of the opening 43a.

Figure 8B:
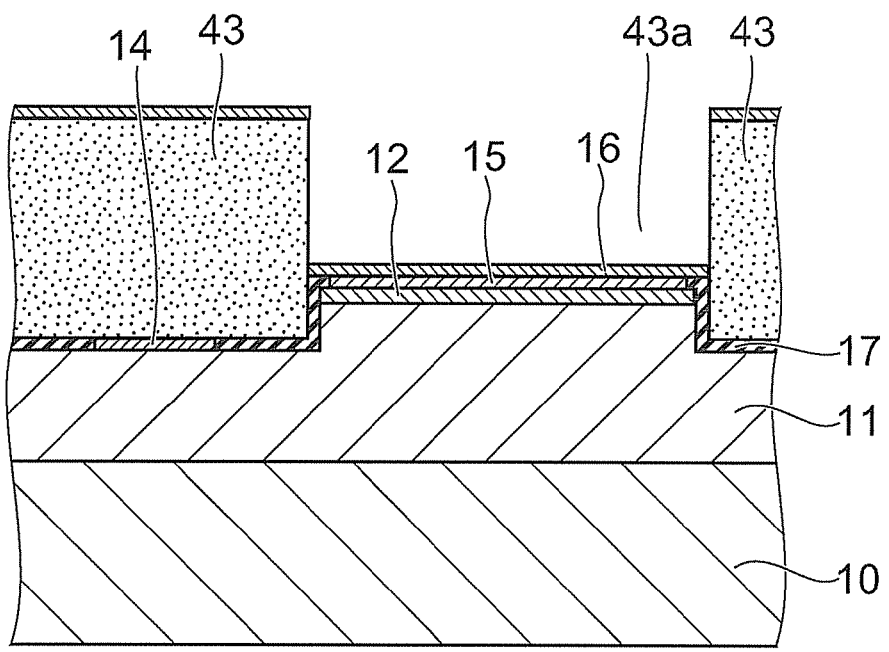

Next, as shown in FIG. 8B, a barrier metal layer 16 is formed illustratively by an evaporation process on the surface of the p-side electrode 15 exposed to the bottom of the opening 43a. The barrier metal layer 16 entirely covers the exposed surface of the p-side electrode 15.

Figure 9A:
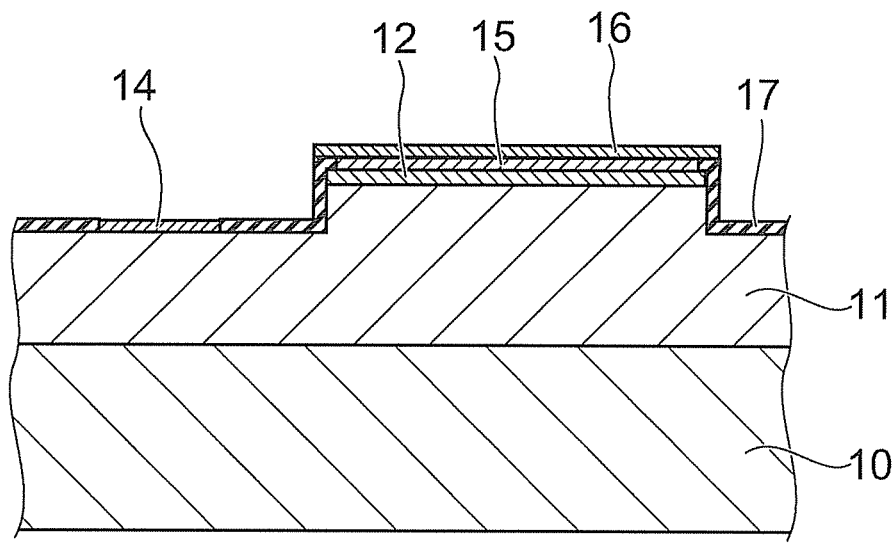

Next, the resist film 43 and the same metal film as the barrier metal layer formed on the upper surface of the resist film 43 are removed by a lift-off process, which results in the configuration of FIG. 9A.

Figure 9B:
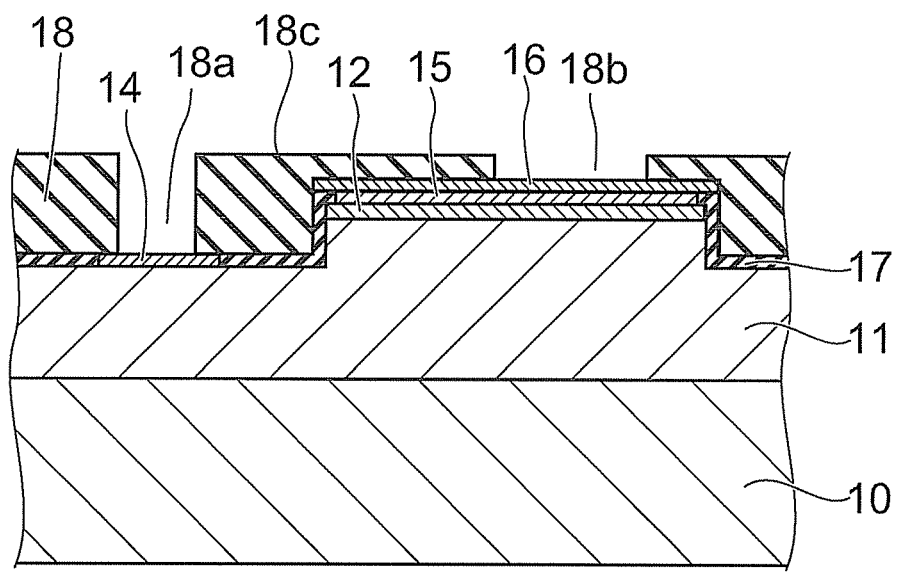

Next, as shown in FIG. 9B, an insulating film 18 covering the n-side electrode 14, the p-side electrode 15, the barrier metal layer 16, and the insulating film 17 is formed, and then the upper surface 18c of the insulating film 18 is planarized. Subsequently, an opening 18a reaching the n-side electrode 14 and an opening 18b reaching the barrier metal layer 16 are formed in the insulating film 18.

Next, a seed metal (Cu), not shown, is formed on the upper surface 18c of the insulating film 18 and the inner wall of the openings 18a, 18b, and a plating resist, not shown, is further formed. Then, Cu plating is performed using the seed metal as a current path.

Figure 10A:
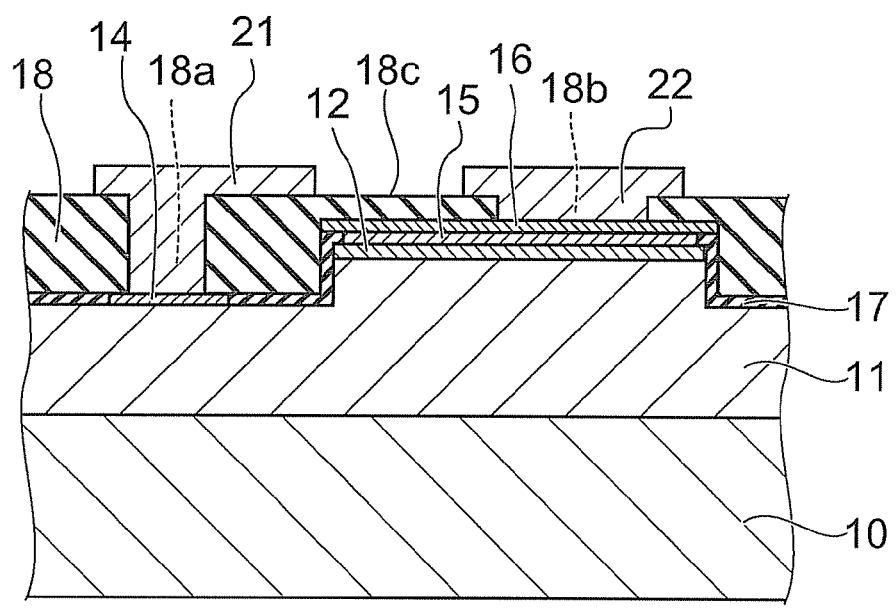

Thus, as shown in FIG. 10A, an n-side interconnection 21 and a p-side interconnection 22 are selectively formed on the upper surface the surface on the opposite side to the first semiconductor layer 11 and the second semiconductor layer 12) 18c of the insulating film 18. The n-side interconnection 21 is formed also in the opening 18a and connected to the n-side electrode 14. The p-side interconnection 22 is formed also in the opening 18b and connected to the barrier metal layer 16.

Figure 10B:
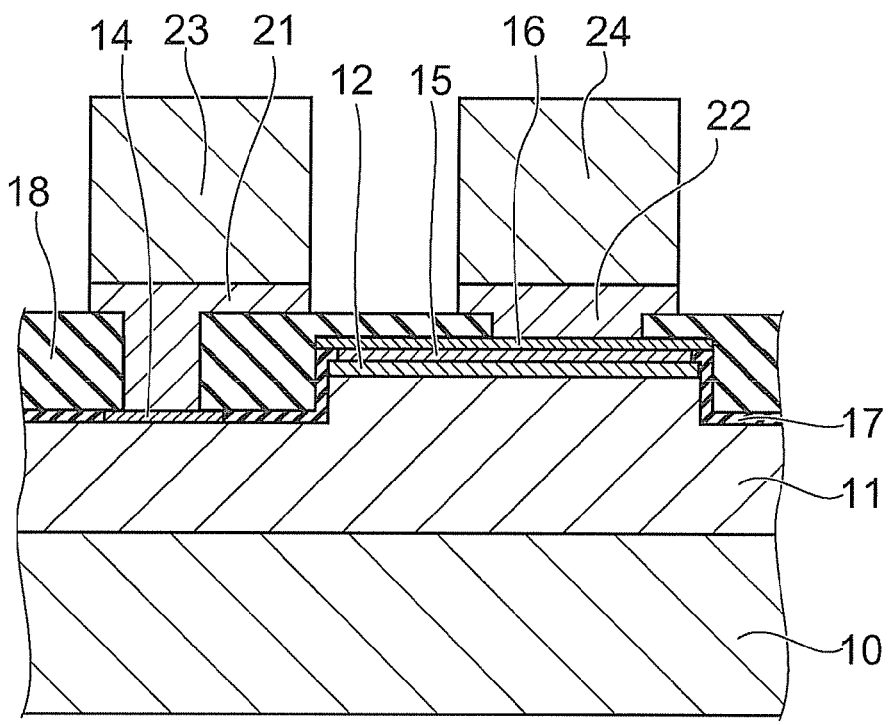

Next, the plating resist used in the plating of the n-side interconnection 21 and the p-side interconnection 22 is removed with chemicals. Then, another plating resist for forming metal pillars is formed, and electrolytic plating is performed using the aforementioned seed metal, the n-side interconnection 21, and the p-side interconnection 22 as a current path. Thus, as shown in FIG. 10B, an n-side metal pillar 23 is formed on the n-side interconnection 21, and a p-side metal pillar 24 is formed on the p-side interconnection 22.

Subsequently, the plating resist for forming metal pillars is removed with chemicals, and furthermore the exposed portion of the seed metal is removed. This breaks the electrical connection between the n-side interconnection 21 and the p-side interconnection 22 through the seed metal.

Figure 11A:
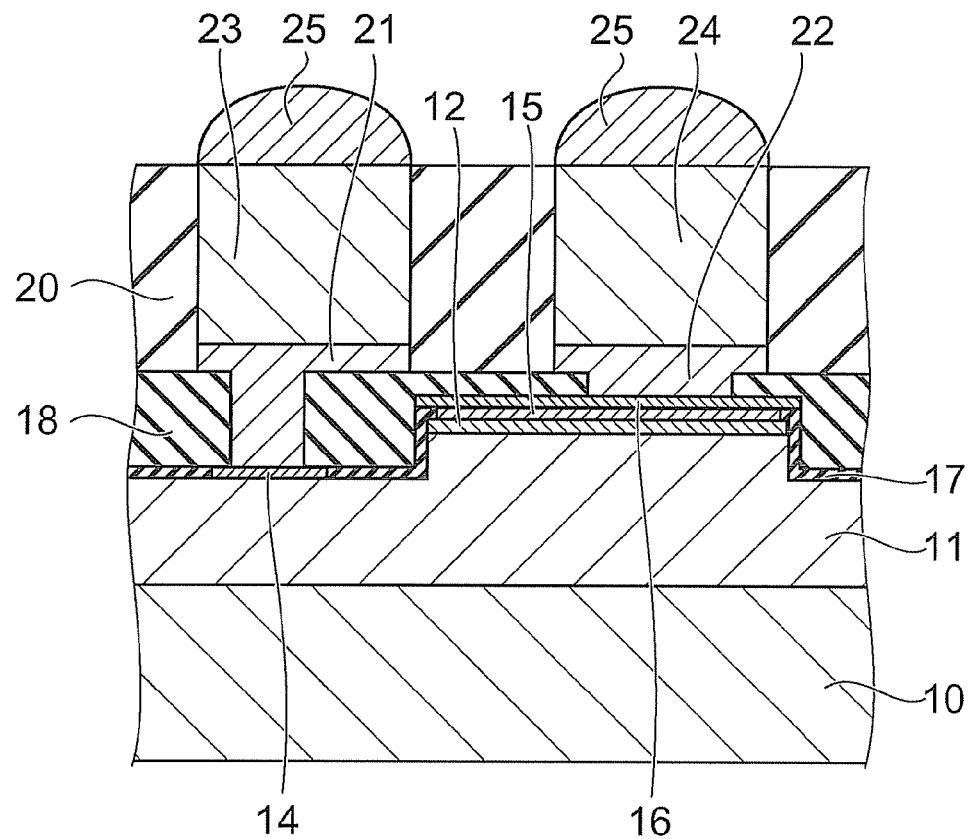

Next, as shown in FIG. 11A, the n-side interconnection 21, the p-side interconnection 22, the n-side metal pillar 23, the p-side metal pillar 24, and the insulating layer 18 are covered with a resin 20. Subsequently, the surface of the resin 20 is ground to expose the upper surface of the n-side metal pillar 23 and the p-side metal pillar 24. Then, external terminals 25 such as solder balls and metal bumps are provided on the exposed surface.

Figure 11B:
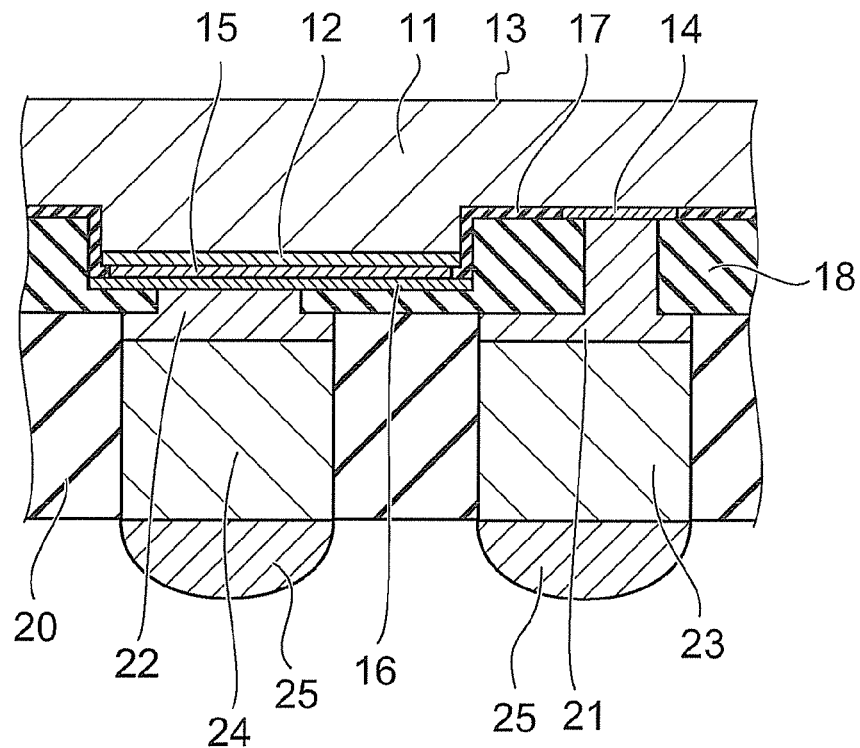

Next, as shown in FIG. 11B, the substrate 10 is removed. Here, FIG. 11B is depicted with the positional relationship turned upside down with respect to FIG. 11A.

The substrate 10 is removed from above the first semiconductor layer 11 illustratively by a laser lift-off process. Specifically, laser light is applied toward the first semiconductor layer 11 from the back surface side of the substrate 10, which is the surface opposite to the surface on which the first semiconductor layer 11 is formed. The laser light has a wavelength to which the substrate 10 is transmissive and which falls in an absorption region of the first semiconductor layer 11.

When the laser light reaches the interface between the substrate 10 and the first semiconductor layer 11, the first semiconductor layer 11 near the interface is decomposed by absorbing the energy of the laser light. For instance, in the case where the first semiconductor layer 11 is made of GaN, it is decomposed into Ga and nitrogen gas. This decomposition reaction forms a small gap between the substrate 10 and the first semiconductor layer 11, and separates the substrate 10 from the first semiconductor layer 11. Irradiation with laser light is performed a plurality of times on predefined regions across the wafer to remove the substrate 10.

After the substrate 10 is removed, as shown in FIG. 1, a phosphor layer 27 is formed on the first major surface 13 of the first semiconductor layer 11. For instance, the phosphor layer 27 is formed by applying a liquid resin mixed with phosphor particles by a spin coating process, and then heat-curing it.

Because the phosphor layer 27 is formed after the substrate 10 is removed from above the first major surface 13, the substrate 10 does not exist between the first major surface 13 and the phosphor layer 27, which serves to increase the light extraction efficiency.

Subsequently, by dicing, a singulated semiconductor light emitting device is obtained. Because the substrate 10 has already been removed, dicing can be easily performed, and the productivity can be improved. Singulation is performed by cutting around a region including at least one second semiconductor layer 12. For instance, as indicated by dot-dashed lines in FIG. 3B, dicing may be performed so that one second semiconductor layer 12 is treated as one unit. Alternatively, as indicated by double-dot-dashed lines, dicing may be performed so that a plurality of second semiconductor layers 12 are treated as one unit.

The aforementioned processes up to dicing are each performed collectively in a wafer state, which eliminates the need of interconnection and packaging for each singulated device, enabling significant reduction of production cost. That is, interconnection and packaging have already been finished in the singulated device. Furthermore, it is easy to achieve downsizing in which the planar size of the individual device is close to the planar size of the bare chip (the stacked body of the first semiconductor layer 11 and the second semiconductor layer 12).

Figure 12:
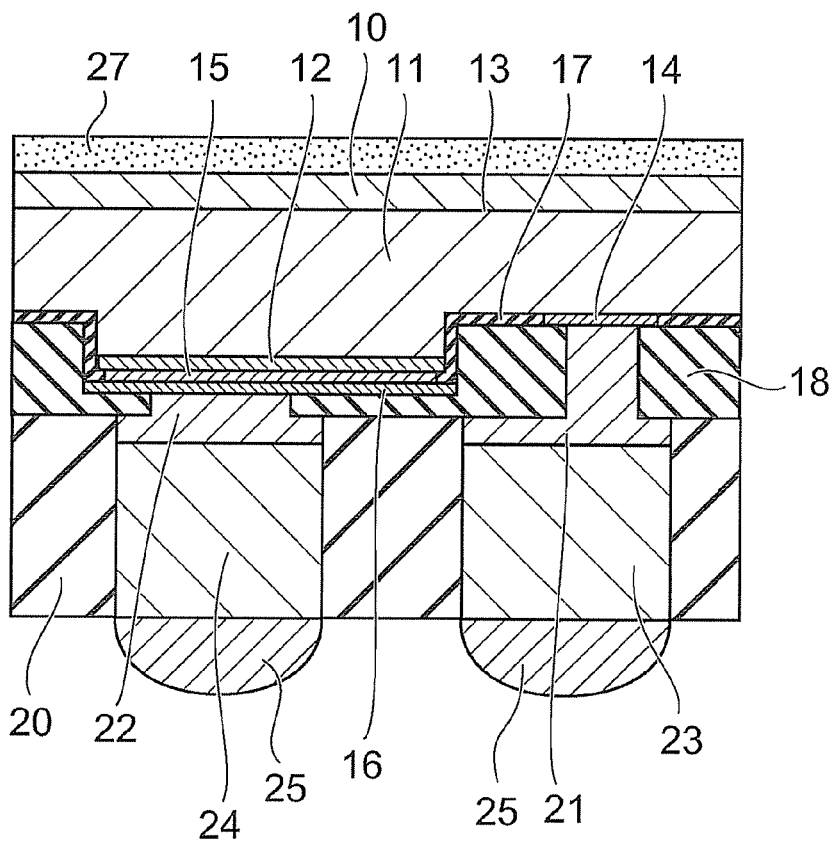
FIG. 12 is a schematic cross-sectional view of a semiconductor light emitting device of another embodiment.

Here, the substrate 10 may not be completely removed, but may be thinly ground and left on the first major surface 13 of the first semiconductor layer 11 as shown in FIG. 12. By thinning and leaving the substrate 10, it is possible to achieve higher mechanical strength, and hence a more reliable structure, than the structure in which the substrate 10 is completely removed. Furthermore, the remaining substrate 10 can suppress warpage after singulation, and facilitates mounting on a circuit board and the like.

Because of not being opposed to the light emitting layer, the n-side electrode 14 may not include a silver (Ag) layer functioning as a reflective metal layer. No use of silver (Ag) in the n-side electrode 14 can serve to cost reduction. Alternatively, by forming the n-side electrode 14 and the p-side electrode 15 simultaneously from the same material, the number of processes can be reduced, and cost reduction can be achieved. In this case, the n-side electrode 14 also includes a silver (Ag) layer. Hence, to suppress its sulfidation, preferably, the n-side electrode 14 is also covered with the barrier metal layer 16.

Figure 13:
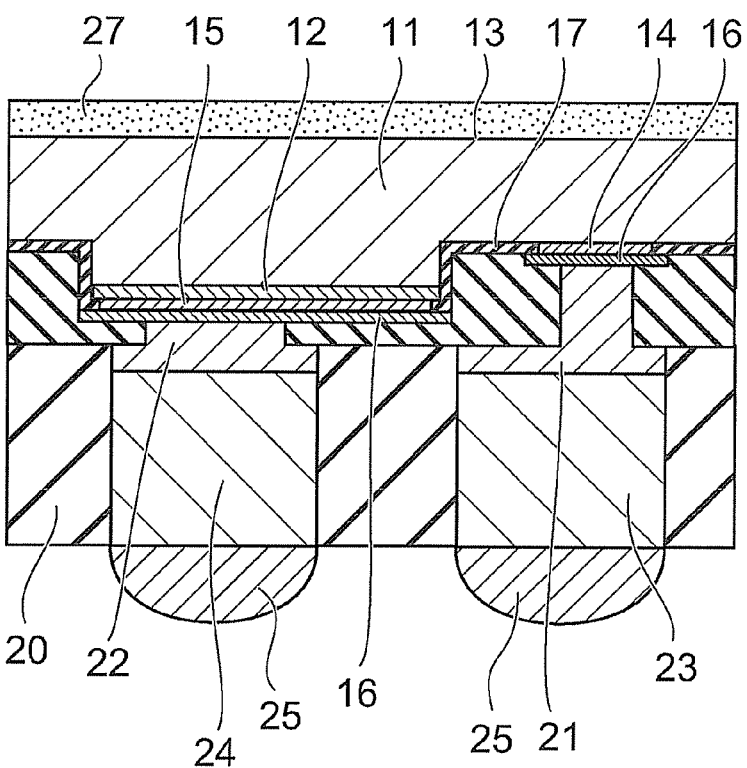
FIG. 13 is a schematic cross-sectional view of a semiconductor light emitting device of still another embodiment.

More specifically, as shown in FIG. 13, the barrier metal layer 16 covers the surface of the n-side electrode 14 on the opposite side to the first semiconductor layer 11. The n-side interconnection 21 is electrically connected to the n-side electrode 14 through the barrier metal layer 16. The barrier metal layer 16 covering the p-side electrode 15 and the barrier metal layer 16 covering the n-side electrode 14 are formed simultaneously from the same material. However, the barrier metal layer 16 covering the p-side electrode 15 is separated and electrically disconnected from the barrier metal layer 16 covering the n-side electrode 14.

In the above embodiments, the p-side electrode 15 is formed after the n-side electrode 14 is formed. However, it is also possible to first form the p-side electrode 15, and subsequently form the n-side electrode 14.

The embodiments have been described with reference to examples. However, the embodiments are not limited thereto, but can be variously modified within the spirit of the invention. The material, size, shape, layout and the like of the substrate, semiconductor layer, electrode, interconnection, metal pillar, insulating film, and resin can be variously modified by those skilled in the art, and such modifications are also encompassed within the scope of the invention as long as they do not depart from the spirit of the invention.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor light emitting device comprising:
   a semiconductor layer having a first major surface, a second major surface opposite to the first major surface, and a light emitting layer, the semiconductor layer not including a substrate on the first major surface side;
   a first electrode provided on the second major surface of the semiconductor layer;
   a second electrode provided on the second major surface of the semiconductor layer and including a silver layer;
   a first interconnection connected to the first electrode;
   a second interconnection connected to the second electrode;
   a barrier metal layer provided on a surface of the second electrode on an opposite side to the second major surface, the barrier metal layer being made of a metal material different from a material of the second electrode, the first interconnection and the second interconnection;
   a first metal pillar provided on a surface of the first interconnection on an opposite side to the first electrode;
   a second metal pillar provided on a surface of the second interconnection on an opposite side to the second electrode;
   a resin provided between the first metal pillar and the second metal pillar; and
   a phosphor layer provided on the first major surface side without a substrate between the first major surface and the phosphor layer.

2. The device of claim 1, wherein the barrier metal layer includes at least one metal selected from titanium, tantalum, and ruthenium.

3. The device of claim 1, wherein the second interconnection is connected to the second electrode through the barrier metal layer.

4. The device of claim 1, wherein
   the barrier metal layer is larger in planar size than the second electrode, and
   the barrier metal layer covers an entire surface of the second electrode on an opposite side to the semiconductor layer.

5. The device of claim 1, wherein the first interconnection, the second interconnection, the first metal pillar and the second metal pillar are made of the same metal material.

6. The device of claim 1, wherein
   the semiconductor layer includes a gallium nitride layer, and
   the second electrode includes a contact layer provided between the gallium nitride layer and the silver layer, and forming an alloy with gallium contained in the gallium nitride layer.

7. The device of claim 1, wherein the barrier metal layer covers also a surface of the first electrode on an opposite side to the semiconductor layer, and the first interconnection is connected to the first electrode through the barrier metal layer.

8. The device of claim 1, wherein a thickness of each of the first metal pillar and the second metal pillar is thicker than a thickness of a stacked body including the semiconductor layer, the first electrode, the second electrode, the barrier metal layer, the first interconnection, and the second interconnection.

9. The device of claim 1, wherein the semiconductor layer had been crystal-grown on a substrate.

10. The device of claim 1, wherein the resin supports the semiconductor layer together with the first metal pillar and the second metal pillar.

11. The device of claim 1, wherein the first metal pillar has a connectable end portion, and the second metal pillar has a connectable end portion.

12. A semiconductor light emitting device comprising:
    a semiconductor layer having a first major surface, a second major surface opposite to the first major surface, and a light emitting layer, the semiconductor layer not including a substrate on the first major surface side;
    a first electrode provided on the second major surface of the semiconductor layer;
    a second electrode provided on the second major surface of the semiconductor layer and including a silver layer;
    a first interconnection connected to the first electrode;
    a second interconnection connected to the second electrode;
    a barrier metal layer provided on a surface of the second electrode on an opposite side to the second major surface, the barrier metal layer including at least one metal selected from titanium, tantalum, and ruthenium;
    a first metal pillar provided on a surface of the first interconnection on an opposite side to the first electrode;
    a second metal pillar provided on a surface of the second interconnection on an opposite side to the second electrode;
    a resin provided between the first metal pillar and the second metal pillar; and
    a phosphor layer provided on the first major surface side without a substrate between the first major surface and the phosphor layer.

13. The device of claim 12, wherein the second interconnection is connected to the second electrode through the barrier metal layer.

14. The device of claim 12, wherein
    the barrier metal layer is larger in planar size than the second electrode, and
    the barrier metal layer covers an entire surface of the second electrode on an opposite side to the semiconductor layer.

15. The device of claim 12, wherein the first interconnection, the second interconnection, the first metal pillar and the second metal pillar are made of the same metal material.

16. The device of claim 12, wherein
    the semiconductor layer includes a gallium nitride layer, and the second electrode includes a contact layer provided between the gallium nitride layer and the silver layer, and forming an alloy with gallium contained in the gallium nitride layer.

17. The device of claim 12, wherein the barrier metal layer covers also a surface of the first electrode on an opposite side to the semiconductor layer, and the first interconnection is connected to the first electrode through the barrier metal layer.

18. The device of claim 12, wherein a thickness of each of the first metal pillar and the second metal pillar is thicker than a thickness of a stacked body including the semiconductor layer, the first electrode, the second electrode, the barrier metal layer, the first interconnection, and the second interconnection.

19. The device of claim 12, wherein the semiconductor layer had been crystal-grown on a substrate.

20. The device of claim 12, wherein the resin supports the semiconductor layer together with the first metal pillar and the second metal pillar.

21. The device of claim 12, wherein the first metal pillar has a connectable end portion, and the second metal pillar has a connectable end portion.

* * * * *